United States Patent
Lee et al.

(10) Patent No.: US 9,076,982 B2
(45) Date of Patent: Jul. 7, 2015

(54) PATTERNING SLIT SHEET ASSEMBLY, ORGANIC LAYER DEPOSITION APPARATUS, METHOD OF MANUFACTURING ORGANIC LIGHT-EMITTING DISPLAY APPARATUS, AND THE ORGANIC LIGHT-EMITTING DISPLAY APPARATUS

(71) Applicant: Samsung Display Co., Ltd., Yongin, Gyeonggi-Do (KR)

(72) Inventors: Sung-Bong Lee, Yongin (KR); Myung-Ki Lee, Yongin (KR); Myong-Hwan Choi, Yongin (KR); Mu-Hyun Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/222,472

(22) Filed: Mar. 21, 2014

(65) Prior Publication Data
US 2014/0203264 A1    Jul. 24, 2014

Related U.S. Application Data

(62) Division of application No. 13/469,066, filed on May 10, 2012, now Pat. No. 8,707,889.

(30) Foreign Application Priority Data

May 25, 2011  (KR) .......................... 10-2011-0049791

(51) Int. Cl.
*B05C 1/00*   (2006.01)
*H01L 51/52*  (2006.01)
(Continued)

(52) U.S. Cl.
CPC .......... *H01L 51/5203* (2013.01); *C23C 14/042* (2013.01); *H01L 51/0011* (2013.01); *H01L 51/56* (2013.01)

(58) Field of Classification Search
CPC .... C23C 14/042; H01L 51/56; H01L 51/0011
USPC ............... 118/213, 504, 719; 445/30, 47, 68; 438/975; 257/E21.09
See application file for complete search history.

(56) References Cited

U.S. PATENT DOCUMENTS

| 5,348,506 A | 9/1994 | Kawamura et al. |
| 6,274,198 B1 | 8/2001 | Dautartas |

(Continued)

FOREIGN PATENT DOCUMENTS

| EP | 1 413 644 A2 | 4/2004 |
| EP | 1 418 250 A2 | 5/2004 |

(Continued)

OTHER PUBLICATIONS

Patent Abstracts of Japan, and English machine translation of Japanese Publication 2001-052862, 20 pages.

(Continued)

*Primary Examiner* — Khaja Ahmad
(74) *Attorney, Agent, or Firm* — Christie, Parker & Hale, LLP

(57) ABSTRACT

A patterning slit sheet assembly for performing a deposition process to form a thin film on a substrate in a desired fine pattern. The patterning slit sheet assembly includes a patterning slit sheet having a plurality of slits, a frame combined with the patterning slit sheet to support the patterning slit sheet, and a support unit including an upper member that is allowed to be moved or fixed to support the patterning slit sheet when a gravitational force is applied to the patterning slit sheet and a lower member disposed more apart from the patterning slit sheet than the upper member, wherein the upper member is fixed on the lower member.

4 Claims, 12 Drawing Sheets

(51) Int. Cl.
  *C23C 14/04* (2006.01)
  *H01L 51/56* (2006.01)
  *H01L 51/00* (2006.01)

(56) References Cited

U.S. PATENT DOCUMENTS

| | | |
|---|---|---|
| 6,371,451 B1 | 4/2002 | Choi |
| 6,749,906 B2 | 6/2004 | Van Slyke |
| 7,006,202 B2 | 2/2006 | Byun et al. |
| 2001/0006827 A1 | 7/2001 | Yamazaki et al. |
| 2002/0017245 A1 | 2/2002 | Tsubaki et al. |
| 2002/0076847 A1 | 6/2002 | Yamada et al. |
| 2002/0168577 A1 | 11/2002 | Yoon |
| 2003/0101932 A1 | 6/2003 | Kang |
| 2003/0101937 A1 | 6/2003 | Van Slyke et al. |
| 2003/0168013 A1 | 9/2003 | Freeman et al. |
| 2003/0221614 A1 | 12/2003 | Kang et al. |
| 2003/0232563 A1 | 12/2003 | Kamiyama et al. |
| 2004/0115338 A1 | 6/2004 | Yoneda |
| 2004/0127066 A1 | 7/2004 | Jung |
| 2004/0134428 A1 | 7/2004 | Sasaki et al. |
| 2004/0142108 A1 | 7/2004 | Atobe et al. |
| 2004/0144321 A1 | 7/2004 | Grace et al. |
| 2004/0194702 A1 | 10/2004 | Sasaki et al. |
| 2005/0016461 A1 | 1/2005 | Klug et al. |
| 2005/0031836 A1 | 2/2005 | Hirai |
| 2005/0037136 A1 | 2/2005 | Yamamoto |
| 2005/0110400 A1 | 5/2005 | Nakamura |
| 2005/0166842 A1 | 8/2005 | Sakamoto |
| 2006/0022590 A1 | 2/2006 | Aziz et al. |
| 2006/0103289 A1* | 5/2006 | Kim et al. ............... 313/402 |
| 2006/0144325 A1 | 7/2006 | Jung et al. |
| 2006/0174829 A1 | 8/2006 | An et al. |
| 2006/0205101 A1 | 9/2006 | Lee et al. |
| 2007/0077358 A1 | 4/2007 | Jeong et al. |
| 2007/0157879 A1 | 7/2007 | Yotsuya |
| 2007/0178708 A1 | 8/2007 | Ukigaya |
| 2007/0190889 A1* | 8/2007 | Lee et al. ............... 445/47 |
| 2008/0003350 A1 | 1/2008 | Kim et al. |
| 2008/0018236 A1 | 1/2008 | Arai et al. |
| 2008/0115729 A1 | 5/2008 | Oda et al. |
| 2008/0129194 A1 | 6/2008 | Abe et al. |
| 2008/0131587 A1 | 6/2008 | Boroson et al. |
| 2008/0174235 A1 | 7/2008 | Kim et al. |
| 2008/0216741 A1 | 9/2008 | Ling |
| 2009/0017192 A1 | 1/2009 | Matsuura |
| 2009/0220691 A1 | 9/2009 | Kim |
| 2009/0232976 A1 | 9/2009 | Yoon et al. |
| 2010/0001301 A1 | 1/2010 | Karg et al. |
| 2010/0192856 A1 | 8/2010 | Sung et al. |
| 2011/0033964 A1* | 2/2011 | Oh et al. ............... 438/34 |
| 2011/0053300 A1* | 3/2011 | Ryu et al. ............... 438/34 |
| 2011/0174217 A1* | 7/2011 | Gersdorff et al. ............... 118/500 |

FOREIGN PATENT DOCUMENTS

| | | |
|---|---|---|
| EP | 1 518 940 A1 | 3/2005 |
| JP | 04-272170 | 9/1992 |
| JP | 2000-068054 | 3/2000 |
| JP | 2001-052862 | 2/2001 |
| JP | 2001-093667 | 4/2001 |
| JP | 2002-175878 | 6/2002 |
| JP | 2003-003250 | 1/2003 |
| JP | 2003-077662 | 3/2003 |
| JP | 2003-157973 | 5/2003 |
| JP | 2003-297562 | 10/2003 |
| JP | 2003-321767 | 11/2003 |
| JP | 2004-043898 | 2/2004 |
| JP | 2004-103269 | 4/2004 |
| JP | 2004-103341 | 4/2004 |
| JP | 2004-199919 | 7/2004 |
| JP | 2005-044592 | 2/2005 |
| JP | 2005-122980 A | 5/2005 |
| JP | 2005-235568 | 9/2005 |
| JP | 2005-293968 | 10/2005 |
| JP | 2005-296737 | 10/2005 |
| JP | 10 2006-0020050 | 3/2006 |
| JP | 2006-275433 | 10/2006 |
| JP | 2007-047293 | 2/2007 |
| JP | 2007-186740 | 7/2007 |
| JP | 2008-108628 | 5/2008 |
| JP | 2008-121098 | 5/2008 |
| JP | 2008-521165 A | 6/2008 |
| JP | 2009-019243 | 1/2009 |
| JP | 2009-87910 | 4/2009 |
| KR | 10-0257219 B1 | 2/2000 |
| KR | 10-2000-0019254 | 4/2000 |
| KR | 10-2000-0023929 | 5/2000 |
| KR | 2001-0024652 | 3/2001 |
| KR | 10-2001-0059939 | 7/2001 |
| KR | 20-0257218 | 12/2001 |
| KR | 10-2002-0000201 | 1/2002 |
| KR | 2002-0001555 | 1/2002 |
| KR | 10-2002-0050922 | 6/2002 |
| KR | 10-2003-0001745 | 1/2003 |
| KR | 2003-0046090 | 6/2003 |
| KR | 2003-0069684 | 8/2003 |
| KR | 10-0405080 B1 | 11/2003 |
| KR | 10-2003-0091947 | 12/2003 |
| KR | 10-2003-0093959 | 12/2003 |
| KR | 10-2004-0034537 | 4/2004 |
| KR | 10-2004-0050045 | 6/2004 |
| KR | 10-2004-0069281 | 8/2004 |
| KR | 10-2004-0084747 | 10/2004 |
| KR | 10-0463212 B1 | 12/2004 |
| KR | 10-0520159 B1 | 10/2005 |
| KR | 10-2006-0008602 | 1/2006 |
| KR | 10-2006-0018745 | 3/2006 |
| KR | 10-2006-0049050 | 5/2006 |
| KR | 10-2006-0056706 | 5/2006 |
| KR | 10-2006-0058459 | 5/2006 |
| KR | 10-2006-0059068 | 6/2006 |
| KR | 10-2006-0065978 | 6/2006 |
| KR | 10-2006-0073367 | 6/2006 |
| KR | 10-2006-0080475 | 7/2006 |
| KR | 10-2006-0080481 | 7/2006 |
| KR | 10-2006-0080482 | 7/2006 |
| KR | 10-2006-0083510 | 7/2006 |
| KR | 10-2006-0092387 | 8/2006 |
| KR | 10-2006-0098755 | 9/2006 |
| KR | 10-2006-0104675 | 10/2006 |
| KR | 10-2006-0104677 | 10/2006 |
| KR | 10-2006-0109627 | 10/2006 |
| KR | 10-0635903 | 10/2006 |
| KR | 10-0645719 | 11/2006 |
| KR | 10-0646160 B1 | 11/2006 |
| KR | 10-0687007 B1 | 2/2007 |
| KR | 10-2007-0025164 | 3/2007 |
| KR | 10-0696547 B1 | 3/2007 |
| KR | 10-0697663 | 3/2007 |
| KR | 10-0698033 B1 | 3/2007 |
| KR | 10-0700466 B1 | 3/2007 |
| KR | 10-2007-0035796 | 4/2007 |
| KR | 10-0711885 B1 | 4/2007 |
| KR | 10-2007-0050793 | 5/2007 |
| KR | 10-0723627 B1 | 5/2007 |
| KR | 10-0726132 B1 | 6/2007 |
| KR | 10-0739309 | 7/2007 |
| KR | 10-2007-0078713 | 8/2007 |
| KR | 10-2007-0080635 | 8/2007 |
| KR | 10-2007-0093904 | 9/2007 |
| KR | 10-2007-0101842 | 10/2007 |
| KR | 10-2007-0105595 | 10/2007 |
| KR | 10-0770653 B1 | 10/2007 |
| KR | 10-2007-0112668 | 11/2007 |
| KR | 10-2008-0001184 | 1/2008 |
| KR | 10-0797787 B1 | 1/2008 |
| KR | 10-0800125 | 1/2008 |
| KR | 10-0815265 | 3/2008 |
| KR | 10-0823508 B1 | 4/2008 |
| KR | 10-0827760 B1 | 5/2008 |
| KR | 10-2008-0048653 | 6/2008 |
| KR | 10-0839380 B1 | 6/2008 |
| KR | 10-2008-0060400 | 7/2008 |

(56) References Cited

FOREIGN PATENT DOCUMENTS

| KR | 10-2008-0061132 | | 7/2008 |
|---|---|---|---|
| KR | 10-2008-0062212 | | 7/2008 |
| KR | 10-2008-0109559 | A | 12/2008 |
| KR | 10-2009-0038733 | | 4/2009 |
| KR | 10-2009-0093161 | | 9/2009 |
| KR | 10-2009-0097453 | | 9/2009 |
| KR | 10-2010-0000129 | A | 1/2010 |
| KR | 10-2010-0090070 | | 8/2010 |
| WO | WO99/25894 | | 5/1999 |

OTHER PUBLICATIONS

Patent Abstracts of Japan, and English machine translation of Japanese Publication 2003-003250, 25 pages.
Korean Patent Abstracts, Publication No. 1020050045619, dated May 17, 2005, for corresponding Korean Patent 10-0520159 listed above.
Korean Patent Abstracts, Publication No. 1020040062203, dated Jul. 7, 2004, for corresponding Korean Patent 10-0646160 listed above.
Korean Patent Abstracts, Publication No. 1020060101987, dated Sep. 27, 2006, for corresponding Korean Patent 10-0687007 listed above.
Korean Patent Abstracts, Publication No. 1020020056238, dated Jul. 10, 2002, for corresponding Korean Patent 10-0698033 listed above.
Korean Patent Abstracts, Publication No. 1020050078637, dated Aug. 5, 2005, for corresponding Korean Patent 10-0700466 listed above.
Korean Patent Abstracts, Publication No. 1020070025164, dated Mar. 8, 2007, for corresponding Korean Patent 10-0711885 listed above.
Korean Patent Abstracts, Publication No. 1020020034272, dated May 9, 2002, for corresponding Korean Patent 10-0726132 listed above.
Korean Patent Abstracts, Publication No. 10-2007-0056241, dated Jun. 4, 2007, corresponding to Korean Patent 10-0741142 B1 listed above.
Korean Patent Abstracts, Publication No. 1020060126267, dated Dec. 7, 2006, for corresponding Korean Patent 10-0797787 listed above.
Korean Patent Abstracts, Publication No. 1020010062735, dated Jul. 7, 2001, for corresponding Korean Patent 10-0827760 listed above.
Korean Patent Abstracts, Publication No. 1020080038650, dated May 7, 2008, for corresponding Korean Patent 10-0839380 listed above.
Korean Patent Abstracts, Publication No. 1020070050793, dated May 16, 2007, for corresponding Korean Patent 10-0815265 listed above.
English Abstract, Publication No. KR20080002189 dated Jan. 4, 2008, for corresponding Korean Patent 10-0800125 listed above.
Korean Notice of Allowance dated Nov. 25, 2011 for Korean Patent Application No. 10-2010-0014277, 5 pages.
Korean Notice of Allowance dated Sep. 28, 2011 for Korean Patent Application No. 10-2009-0042357, 5 pages.
Korean Notice of Allowance dated Jan. 13, 2012 for Korean Patent Application No. 10-2009-0056529, 5 pages.
Korean Office action dated Feb. 1, 2012 for Korean Application No. 10-2010-0011196, 4 pages.
Korean Office action dated Feb. 1, 2012 for Korean Application No. 10-2010-0013848, 3 pages.
U.S. Office action dated May 28, 2013 for corresponding parent U.S. Appl. No. 13/469,066, 24 pages.
U.S. Office action dated Sep. 25, 2013 for corresponding parent U.S. Appl. No. 13/469,066, 13 pages.
Patent Abstracts of Japan, and English machine translation of Japanese Publication 2001-052862, 20 pages, Feb. 23, 2001.
Patent Abstracts of Japan, and English machine translation of Japanese Publication 2003-003250, 25 pages, Jan. 8, 2003.
Korean Patent Abstracts, Publication No. 1020020086047, dated Nov. 18, 2002, for corresponding Korean Patent 10-0405080 listed above.
Korean Patent Abstracts, Publication No. 1020020088662, dated Nov. 29, 2002, for corresponding Korean Patent 10-0463212 listed above.

\* cited by examiner

PATTERNING SLIT SHEET ASSEMBLY, ORGANIC LAYER DEPOSITION APPARATUS, METHOD OF MANUFACTURING ORGANIC LIGHT-EMITTING DISPLAY APPARATUS, AND THE ORGANIC LIGHT-EMITTING DISPLAY APPARATUS

CROSS-REFERENCE TO RELATED PATENT APPLICATION

This application is a divisional of U.S. patent application Ser. No. 13/469,066, filed May 10, 2012, which claims priority to and the benefit of Korean Patent Application No. 10-2011-0049791, filed May 25, 2011, the entire content of both of which is incorporated herein by reference.

BACKGROUND

1. Field

One or more aspects of embodiments of the present invention relate to a patterning slit sheet assembly, an organic layer deposition apparatus, a method of manufacturing an organic light-emitting display apparatus, and the organic light-emitting display apparatus.

2. Description of Related Art

Organic light-emitting display devices have a larger viewing angle, better contrast characteristics, and a faster response rate than other display devices, and thus have drawn attention as next-generation display devices.

An organic light-emitting display device includes an intermediate layer, which includes an organic emission layer, between a first electrode and a second electrode that are arranged opposite to (arranged to face) each other. The electrodes and the intermediate layer may be formed via various suitable methods, one of which is a deposition method.

There is a need to manufacture larger and high-definition organic light emitting display apparatuses. However, it is practically very difficult to form a thin film, such as the intermediate layer, in a fine pattern and the luminous efficiency of the organic emission layer included in the intermediate layer may vary according to a deposition process. Thus, manufacturing of organic light emitting display devices having satisfactory driving voltage, current density, brightness, color purity, light-emission efficiency, and life-span characteristics is limited.

SUMMARY

Aspects of embodiments of the present invention are directed toward a patterning slit sheet assembly for depositing a thin film in a fine pattern, an organic layer deposition apparatus, a method of manufacturing an organic light-emitting display apparatus, and the organic light-emitting display apparatus.

According to an embodiment of the present invention, there is provided a patterning slit sheet assembly for depositing a thin film in a desired pattern on a substrate, the patterning slit sheet assembly including a patterning slit sheet having a plurality of slits corresponding to the desired pattern; a frame combined with the patterning slit sheet to support the patterning slit sheet; and a support unit including an upper member which is allowed to be moved or fixed to support the patterning slit sheet when a gravitational force is applied to the patterning slit sheet, and a lower member disposed more apart from the patterning slit sheet than the upper member, wherein the upper member is fixedly disposed on the lower member.

The upper and lower members may extend to cross the plurality of slits.

In one embodiment, after the patterning slit sheet is combined with the frame, the upper member is moved toward the patterning slit sheet to support the patterning slit sheet and is then fixedly disposed on the lower member.

The support unit may further include a middle member. The middle member may be disposed on a surface of the upper member facing the lower member, and may be formed to pass through the lower member. The upper member may be moved without having to be completely detached from the lower member, via the middle member.

A fixed member may be disposed at an end of the middle member facing in a direction opposite another end of the middle member facing the upper member. The upper member may be fixed on the lower member by combining the middle member with the lower member by using the fixed member, after the patterning slit sheet is combined with the frame and the upper member is moved toward the patterning slit sheet.

The support unit may further include a connection member. The connection member may be connected to the frame.

The connection member may be fixed on the frame via an engaging member.

According to another embodiment of the present invention, there is provided an organic layer deposition apparatus for forming an organic layer on a substrate, the organic layer deposition apparatus including a deposition source for discharging a deposition material; a deposition source nozzle unit disposed at a side of the deposition source and including a plurality of deposition source nozzles arranged in a first direction; and a patterning slit sheet assembly. The patterning slit sheet assembly includes a patterning slit sheet having a plurality of slits; a frame combined with the patterning slit sheet to support the patterning slit sheet; and a support unit including an upper member which is allowed to be moved or fixed to support the patterning slit sheet when a gravitational force is applied to the patterning slit sheet, and a lower member disposed more apart from the patterning slit sheet than the upper member, wherein the upper member is fixed on the lower member.

The upper and lower members may extend to cross the plurality of slits.

The upper and lower members may extend in a direction crossing the first direction.

Deposition may be performed while the substrate is moved relative to the organic layer deposition apparatus in the first direction.

The deposition source, the deposition source nozzle unit, and the patterning slit sheet assembly may be integrally formed as one body.

The deposition source, the deposition source nozzle unit, and the patterning slit sheet assembly may be integrally connected as one body by connection members that guide movement of the deposition material.

The connection members may be formed to seal a space between the deposition source, the deposition source nozzle unit, and the patterning slit sheet assembly.

The plurality of deposition source nozzles may be tilted at a predetermined angle.

The plurality of deposition source nozzles may include deposition source nozzles arranged in two rows in the first direction. The deposition source nozzles in the two rows may be tilted to face each other.

According to another embodiment of the present invention, there is provided an organic layer deposition apparatus for forming an organic layer on a substrate, the organic layer deposition apparatus including a deposition source for discharging a deposition material; a deposition source nozzle unit disposed at a side of the deposition source and including a plurality of deposition source nozzles arranged in a first direction; a patterning slit sheet assembly; and a barrier plate assembly. The patterning slit sheet assembly includes a patterning slit sheet having a plurality of slits; a frame combined with the patterning slit sheet to support the patterning slit sheet; and a support unit including an upper member which is allowed to be moved or fixed to support the patterning slit sheet when a gravitational force is applied to the patterning slit sheet, and a lower member disposed more apart from the patterning slit sheet than the upper member, wherein the upper member is fixed on the lower member. The barrier plate assembly includes a plurality of barrier plates that are disposed between the deposition source nozzle unit and the patterning slit sheet in the first direction and that partition a deposition space between the deposition source nozzle unit and the patterning slit sheet assembly into a plurality of sub-deposition spaces.

The upper and lower members may extend to cross the plurality of slits.

The upper and lower members may extend in the first direction.

The organic layer deposition apparatus or the substrate may be moved relative to the other.

The plurality of barrier plates may extend in a second direction substantially perpendicular to the first direction.

The barrier plate apparatus may include a first barrier plate apparatus including a plurality of first barrier plates, and a second barrier plate apparatus including a plurality of second barrier plates.

The plurality of first barrier plates and the plurality of second barrier plates may extend in a second direction substantially perpendicular to the first direction.

The plurality of first barrier plates may be arranged to respectively correspond to the plurality of second barrier plates.

The deposition source may be disposed apart from the barrier plate assembly.

The barrier plate assembly may be disposed apart from the patterning slit sheet assembly.

According to another embodiment of the present invention, there is provided a method of manufacturing an organic light-emitting display apparatus, the method including forming a first electrode on a substrate; forming an intermediate layer on the first electrode, the intermediate layer including an organic emission layer; and forming a second electrode on the intermediate layer. The forming of the intermediate layer is performed by using an organic layer deposition apparatus and while the substrate is moved relative to the organic layer deposition apparatus in the first direction. The organic layer deposition apparatus includes a deposition source for discharging a deposition material; a deposition source nozzle unit disposed at a side of the deposition source and including a plurality of deposition source nozzles arranged in a first direction; and a patterning slit sheet assembly including a patterning slit sheet having a plurality of slits; a frame combined with the patterning slit sheet to support the patterning slit sheet; and a support unit including an upper member which is allowed to be moved or fixed to support the patterning slit sheet when a gravitational force is applied to the patterning slit sheet, and a lower member disposed more apart from the patterning slit sheet than the upper member, wherein the upper member is fixed on the lower member.

According to another embodiment of the present invention, there is provided a method of manufacturing an organic light-emitting display apparatus, the method including forming a first electrode on a substrate; forming an intermediate layer on the first electrode, the intermediate layer including an emission layer; and forming a second electrode on the intermediate layer. The forming of the intermediate layer is performed by using an organic layer deposition apparatus and while the substrate is moved relative to the organic layer deposition apparatus. The organic layer deposition apparatus includes a deposition source for discharging a deposition material; a deposition source nozzle unit disposed at a side of the deposition source and including a plurality of deposition source nozzles arranged in a first direction; a patterning slit sheet assembly; and a barrier plate assembly. The patterning slit sheet assembly includes a patterning slit sheet having a plurality of slits; a frame combined with the patterning slit sheet to support the patterning slit sheet; and a support unit including an upper member which is allowed to be moved or fixed to support the patterning slit sheet when a gravitational force is applied to the patterning slit sheet, and a lower member disposed more apart from the patterning slit sheet than the upper member, wherein the upper member is fixed on the lower member. The barrier plate assembly includes a plurality of barrier plates that are disposed between the deposition source nozzle unit and the patterning slit sheet assembly in the first direction and that partition a space between the deposition source nozzle unit and the patterning slit sheet assembly into a plurality of sub-deposition spaces.

According to another embodiment of the present invention, there is provided an organic light-emitting display apparatus manufactured using one of the methods.

BRIEF DESCRIPTION OF THE DRAWINGS

The above and other features of the present invention will become more apparent by describing in detail exemplary embodiments thereof with reference to the attached drawings in which.

DETAILED DESCRIPTION

Hereinafter, exemplary embodiments of the present invention will now be described more fully with reference to the accompanying drawings.

Figure 1:
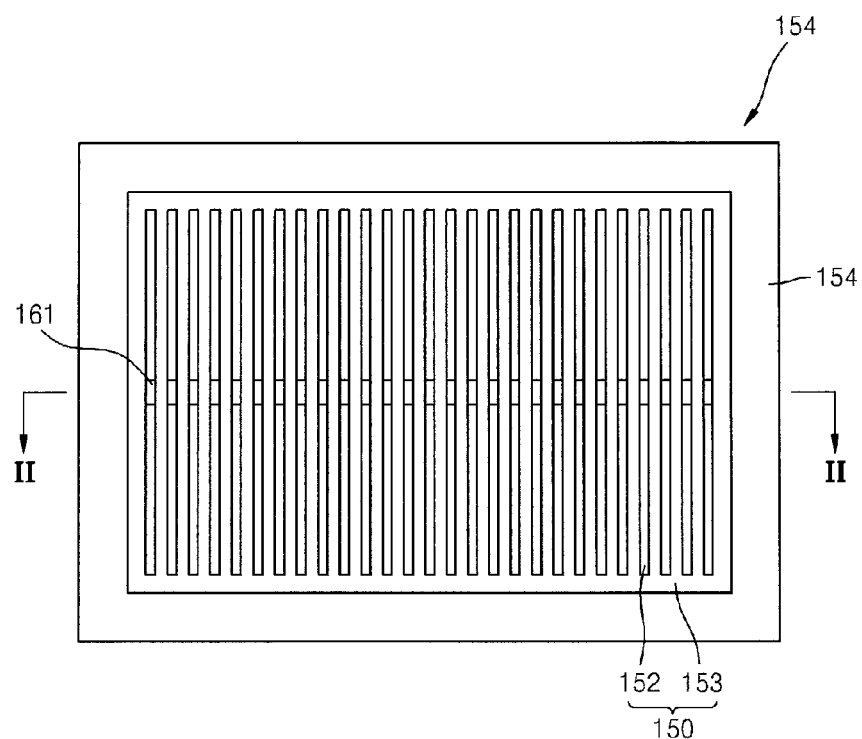
FIG. 1 is a schematic plan view of a patterning slit sheet assembly according to an embodiment of the present invention.
Figure 2:
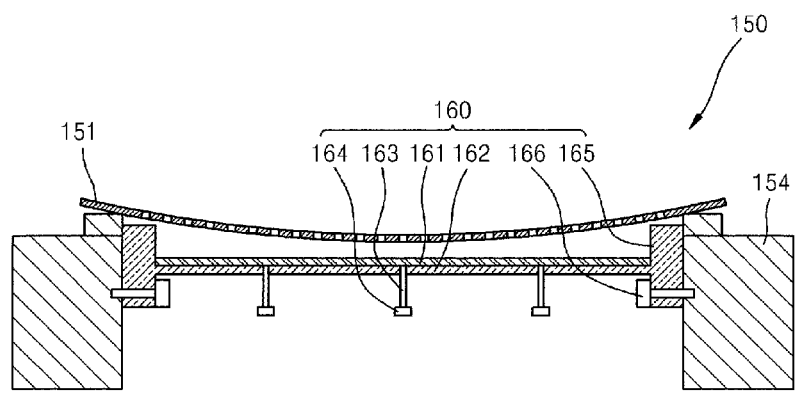
FIGS. 2 and 3 are cross-sectional views taken along the line II-II of FIG. 1, for illustrating an operation of a support unit of the patterning slit sheet assembly of FIG. 1 to support the patterning slit sheet assembly, according to an embodiment of the present invention.
Figure 3:
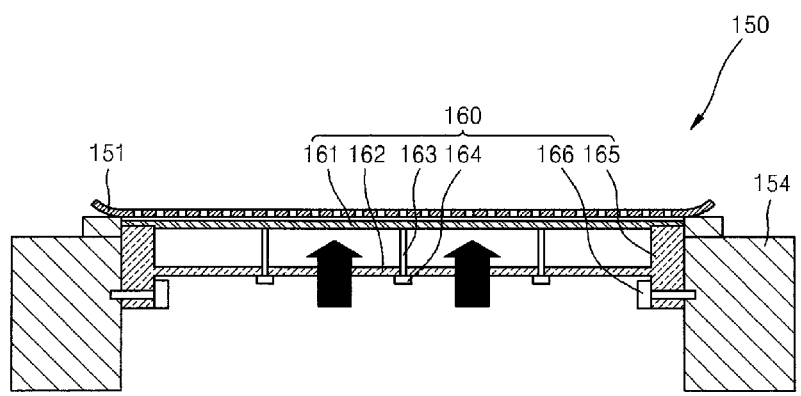

FIG. 1 is a schematic plan view of a patterning slit sheet assembly 150 according to an embodiment of the present invention. FIGS. 2 and 3 are cross-sectional views taken along the line II-II of FIG. 1, for illustrating an operation of a support unit 160 of the patterning slit sheet assembly 150 of FIG. 1 to support the patterning slit sheet assembly 150, according to an embodiment of the present invention.

Referring to FIGS. 1 to 3, the patterning slit sheet assembly 150 includes a patterning slit sheet 151, a frame 154, and the support unit 160.

More specifically, the patterning slit sheet 151 includes a plurality of slits 152 and a non-slit region 153. The plurality of slits 152 are formed in a set or predetermined pattern. In the non-slit region 153, the pattern of slits is not formed.

When a deposition process is performed using the patterning slit sheet assembly 150, a deposition material contained in a deposition source is deposited on a deposition target via the plurality of slits 152.

The patterning slit sheet 151 may be formed according to one of various suitable methods. For example, the plurality of slits 152 may be formed by selectively etching a metal thin film, and the remaining region of the metal thin film that is not etched is used as the non-slit region 153.

The patterning slit sheet 151 is combined with the frame 154. The frame 154 is formed in a lattice shape, similar to a window frame. The frame 154 is combined with one surface of the non-slit region 153 of the patterning slit sheet 151. In this case, the frame 154 and the patterning slit sheet are combined in such a manner that a set or predetermined tensile force may be applied onto the patterning slit sheet 151.

In particular, a degree of pattern precision of the patterning slit sheet 151 may be affected by a manufacturing error of the patterning slit sheet 151 and a thermal expansion error of the patterning slit sheet 151 during the deposition process. A counter force technique may be used to reduce or minimize the manufacturing error of the patterning slit sheet 151. This will now be described in detail below. First, a tensile force is applied onto the patterning slit sheet 151 by applying pressure to the patterning slit sheet 151 from the inside to the outside thereof. Next, a compression force is applied to the frame 154 in an opposite direction to the direction in which the external tensile force is applied to the patterning slit sheet 151, such that the compression force is in equilibrium with the external tensile force applied to the patterning slit sheet 151. Next, the frame 154 and the patterning slit sheet 151 are combined by using, for example, welding. Lastly, the external tensile force applied to the patterning slit sheet 151, which is equilibrium with the compression force applied to the frame 154, is removed so as to apply the tensile force to the patterning slit sheet 151 via the frame 154. When such precise extension, compression, and welding techniques as described above are used, the patterning slit sheet 151 may be manufactured with a manufacturing error of 2 μm or less.

The support unit 160 is formed below the patterning slit sheet 151 to be combined with the frame 154. The support unit 160 includes an upper member 161, a lower member 162, a middle member 163, a fixed member 164, a connection member 165, and an engaging member 166.

The upper member 161 is disposed on the lower member 162, i.e., toward the patterning slit sheet 151.

The middle member 163 is disposed below the upper member 161 to pass through the lower member 162. Thus, the middle member 163 may be moved upward and downward without having to be completely detached from the lower member 162.

The fixed member 164 is disposed on an end of the middle member 163 facing in a direction opposite to another end of the middle member facing the upper member 161. The fixed member 164 combines the middle member 163 with the lower member 162. Thus, the upper member 161 is fixedly disposed on the lower member 162 via the fixed member 164. The fixed member 164 and the lower member 162 may be screwed to each other but the present invention is not limited thereto and they may be combined with each other according to one of the various other suitable ways.

The connection member 165 is connected to the frame 154, and more particularly, is connected to the frame 154 via the engaging member 166. Since the support unit 160 is completely fastened with the frame 154 via the connection member 165, the connection member 165 and the engaging member 166 are formed having durability. Also, the lower member 162 is disposed at a side of the connection member 165.

An operation and advantage of the support unit 160 will now be described. When the frame 154 and the patterning slit sheet 151 are combined as described above, the upper member 161 (disposed below the patterning slip sheet 151, i.e., on the lower member 162 as illustrated in FIG. 2) is pressed upward, i.e., toward the patterning slit sheet 151 as illustrated in FIG. 3. In this case, the upper member 161 pushes the patterning slit sheet 151 upward so that surfaces of the patterning slit sheet 151 may be maintained at a horizontal level. That is, the upper member 161 pushes the patterning slit sheet 151 upward to prevent or block the patterning slit sheet 151 from sagging due to gravity when the patterning slit sheet 151 and the frame 154 are combined. As described above, the middle member 163 allows the upper member 161 to move upward and downward without having to be completely detached from the lower member 162. After the upper member 151 pushes the patterning slit sheet 151 upward to a desired degree as illustrated in FIG. 3, the upper member 161 maintains its own position in the patterning slit sheet 151. To this end, the fixed member 163 disposed on an end of the middle member 163 is combined with the lower member 162. Thus, the middle member 163 is fixedly disposed with respect to the lower member 162, and the upper member 161 is thus also fixedly disposed with respect to the lower member 162 so that the location of the upper member 161 may be maintained constant.

In this case, the fixed member 164 and the lower member 162 may be screwed to each other. In other words, the fixed member 164 and the lower member 162 may be installed to be easily attached to and detached from each other so that the upper member 161 may be easily moved from or fixedly disposed on the lower member 162.

In the current embodiment, the patterning slit sheet assembly 150 applies a tensile force to the patterning slit sheet 151 when the frame 154 and the patterning slit sheet 151 are combined, thereby reducing or minimizing the manufacturing error of the patterning slit sheet 151 and protecting or preventing the patterning slit sheet 151 from being deformed. Accordingly, a deposition process may be performed to form a thin film in a fine pattern on a substrate 500.

Also, the support unit 160 is disposed below the patterning slit sheet 151 to block or prevent the patterning slit sheet 151 from sagging due to gravity. Accordingly, the deposition process may be easily performed in a precise pattern.

Also, since the upper member 161 is installed to be easily moved from and fixedly disposed on the lower member 162, the position of the upper member 161 may be easily adjusted and fixed on the lower member 162 even when the patterning slit sheet 151 can gradually sag during the deposition process. Thus, it is possible to protect or prevent the patterning slit sheet 151 from sagging, thereby easily and precisely controlling a deposited pattern during the deposition process.

Figure 4:
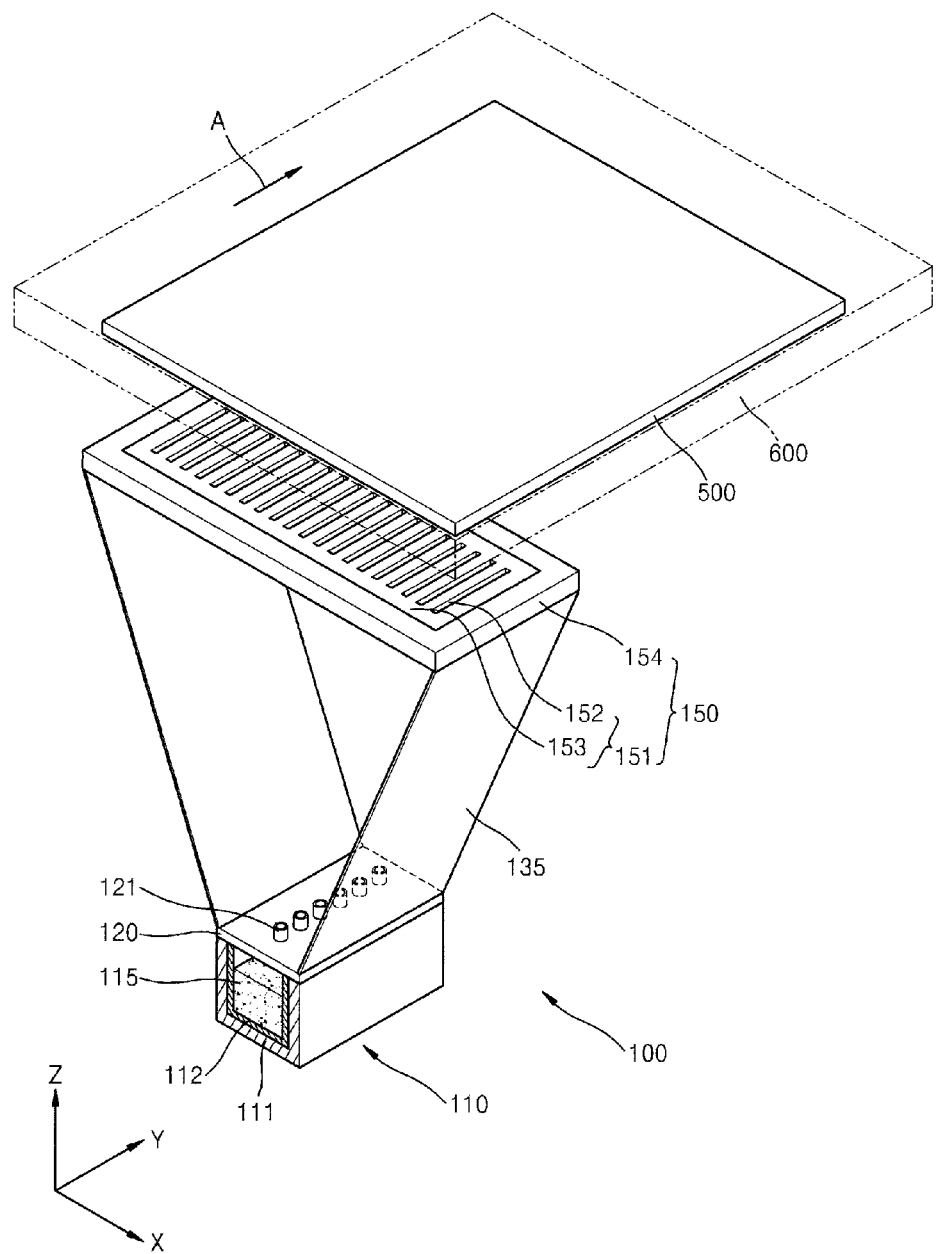
FIG. 4 is a schematic perspective view of an organic layer deposition apparatus according to an embodiment of the present invention.
Figure 5:
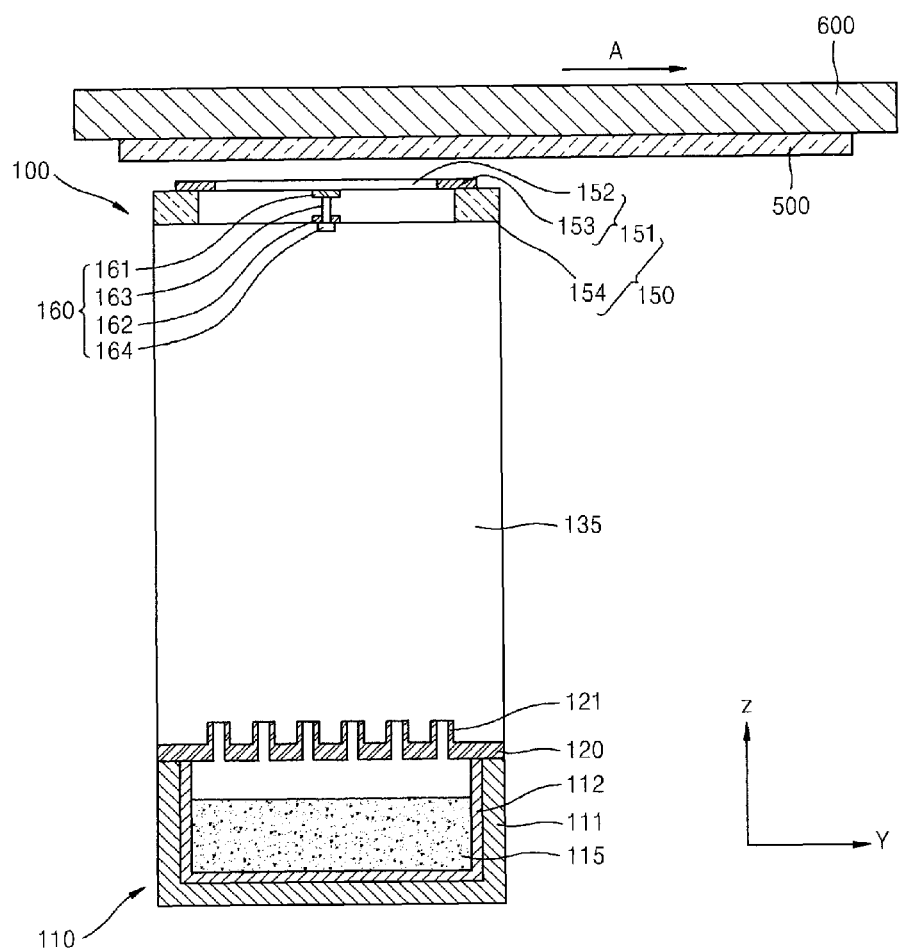
FIG. 5 is a schematic side sectional view of the organic layer deposition apparatus of FIG. 4.
Figure 6:
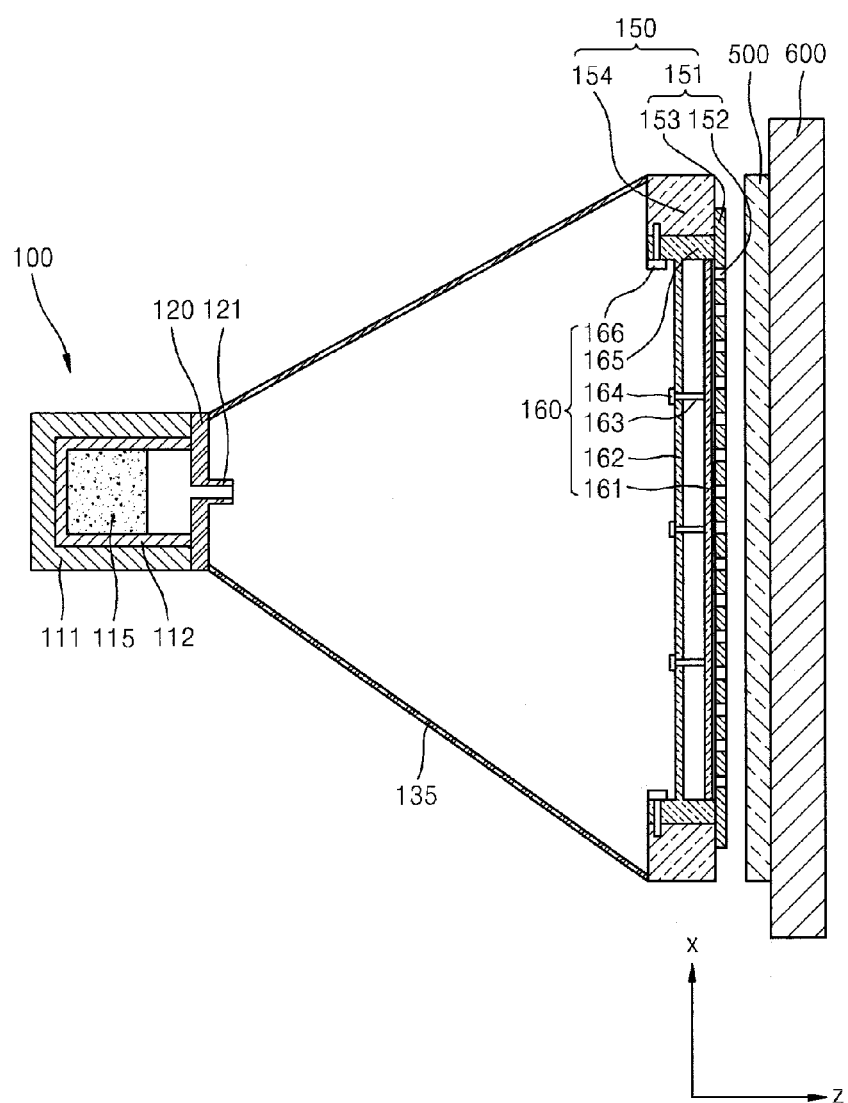
FIG. 6 is a schematic plan sectional view of the organic layer deposition apparatus of FIG. 4.

FIG. 4 is a schematic perspective view of an organic layer deposition apparatus 100 according to an embodiment of the present invention. FIG. 5 is a schematic side sectional view of the organic layer deposition apparatus 100 of FIG. 4. FIG. 6 is a schematic plan sectional view of the organic layer deposition apparatus 100 of FIG. 4. Referring to FIGS. 4 through 6, the organic layer deposition apparatus 100 includes a deposition source 110, a deposition source nozzle unit 120, and a patterning slit sheet assembly 150.

In particularly, a deposition material 115 discharged from the deposition source 110 passes through the deposition source nozzle unit 120 and the patterning slit sheet assembly 150 and is then deposited onto a substrate 500 in a desired pattern. Here, a deposition process that uses the organic layer deposition apparatus 100 may be performed in a chamber that is maintained in a high vacuum. In addition, the temperature of the patterning slit sheet 151 have to be sufficiently lower than that of the deposition source 110. The temperature of the patterning slit sheet 151 may be about 100° C. or less. The temperature of the patterning slit sheet 151 should be sufficiently low so as to reduce thermal expansion of the patterning slit sheet 151.

The substrate 500 may be a substrate for flat panel displays. A large substrate, such as a mother glass, for manufacturing a plurality of flat panel displays, may be used as the substrate 500. Other substrates may also be employed. In the current embodiment, deposition is performed while the substrate 500 is moved relative to the organic layer deposition apparatus 100. The substrate 500 may be disposed on an electrostatic chuck 600 and may be then transferred.

In particular, in a conventional fine metal mask (FMM) deposition method, the size of an FMM has to be equal to the size of a substrate. Thus, since the size of the FMM has to be increased as the substrate becomes larger, it is neither straightforward to manufacture a large FMM nor to extend an FMM to be accurately aligned with a pattern.

In order to overcome this problem, in the organic layer deposition apparatus 100 according to the current embodiment, deposition may be performed while the organic layer deposition apparatus 100 or the substrate 500 is moved relative to the other. In other words, deposition may be continuously performed while the substrate 500, which is disposed such as to face the organic layer deposition apparatus 100, is moved in a Y-axis direction. That is, deposition may be performed in a scanning manner while the substrate 500 is moved in a direction (first direction) indicated by an arrow A in FIG. 4.

In the organic layer deposition apparatus 100 according to the current embodiment, the patterning slit sheet 151 may be significantly smaller than an FMM used in a conventional deposition method. In other words, in the organic layer deposition apparatus 100, deposition is continuously performed, i.e., in a scanning manner while the substrate 500 is moved in the Y-axis direction. Thus, the lengths of the patterning slit sheet 151 in the X-axis and Y-axis directions may be significantly less than the lengths of the substrate 500 in the X-axis and Y-axis directions. As described above, since the patterning slit sheet 151 may be formed to be significantly smaller than a FMM used in a conventional deposition method, it is relatively easy to manufacture the patterning slit sheet 151 used in the present invention. In other words, using the patterning slit sheet 151, which is smaller than the FMM used in the conventional deposition method, is more convenient in all processes, including etching and other subsequent processes, such as precise extension, welding, moving, and cleaning processes, compared to the conventional deposition method using the larger FMM. This is more advantageous for a relatively large display device.

The deposition source 110 that contains and heats the deposition material 115 is disposed at a side facing the substrate 500. While being vaporized in the deposition source 110, the deposition material 115 is deposited on the substrate 500.

Specifically, the deposition source 110 includes a crucible 112 filled with the deposition material 115, and a cooling block 111 that heats the crucible 112 to vaporize the deposition material 115 in the crucible 112 towards a side of the crucible 112, and in particular, towards the deposition source nozzle unit 120. The cooling block 111 insulates or prevents radiation of heat from the crucible 112 to the outside. The cooling block 111 may include a heater that heats the crucible 112.

The deposition source nozzle unit 120 is disposed at a side of the deposition source 110, and in particular, at the side of the deposition source 110 facing the substrate 500. The deposition source nozzle unit 120 includes a plurality of deposition source nozzles 121 that may be arranged at equal intervals in the Y-axis direction, i.e., a scanning direction of the substrate 500. The deposition material 115 that is vaporized in the deposition source 110, passes through the deposition source nozzle unit 120 towards the substrate 500. As described above, when the deposition source nozzle unit 120 includes the plurality of deposition source nozzles 121 arranged in the Y-axis direction, that is, the scanning direction of the substrate 500, the size of a pattern formed of the deposition material 115 discharged through each of a plurality of slits 152 of the patterning slit sheet 151 is affected by the size of one of the deposition source nozzles 121 (since there is only one line of the deposition source nozzles 121 in the X-axis direction). Thus, no shadow zone may be formed on the substrate 500. In addition, since the plurality of deposition source nozzles 121 are arranged in the scanning direction of the substrate 500, even if there is a difference in flux between the plurality of deposition source nozzles 121, the difference may be compensated for and deposition uniformity may be maintained constant.

The patterning slit sheet assembly 150 that includes the patterning slit sheet 151, a frame 154, and a support unit 160, is disposed between the deposition source 110 and the substrate 500. The patterning slit sheet 151 includes the plurality of slits 152 and a non-slit region 153. The plurality of slits 152 are formed in an X-axis direction. The deposition material 115 that is vaporized in the deposition source 110, passes through the deposition source nozzle unit 120 and the patterning slit sheet 151, and particularly, the plurality of slits 152, towards the substrate 500.

The structure of the patterning slit sheet assembly 150 that includes the patterning slit sheet 151, the frame 154, and the support unit 160, is the same as that in the previous embodiment of FIGS. 1 to 3, and will thus not be described here again.

In addition, the deposition source 110 and the deposition source nozzle unit 120 coupled to the deposition source 110 may be disposed apart from the patterning slit sheet assembly 150 by a set or predetermined distance. The deposition source 110 and the deposition source nozzle unit 120 coupled to the deposition source 110 may be connected to the patterning slit sheet assembly 150 by connection members 135. That is, the deposition source 110, the deposition source nozzle unit 120, and the patterning slit sheet assembly 150 may be integrally formed as one body by being connected to each other via the connection members 135. The connection members 135 may guide the deposition material 115, which is discharged through the deposition source nozzles 121, to move straight and not to flow in the X-axis direction. In FIG. 4, the connection members 135 are formed only on left and right sides of the deposition source 110, the deposition source nozzle unit 120, and the patterning slit sheet assembly 150 to guide the deposition material 915 not to flow in the X-axis direction; however, aspects of the present invention are not limited thereto. That is, the connection member 135 may be formed in the form of a sealed box to guide flow of the deposition material 115 both in both the X-axis and Y-axis directions.

As described above, the organic layer deposition apparatus 100 according to the current embodiment performs deposition while being moved relative to the substrate 500. In order to move the organic layer deposition apparatus 100 relative to the substrate 500, the patterning slit sheet assembly 150 is separated from the substrate 500 by a set or predetermined distance.

In particular, in the conventional deposition method using a FMM, deposition is performed with the FMM in close contact with a substrate in order to prevent formation of a shadow zone on the substrate. However, when the FMM is used in close contact with the substrate, the contact may cause defects. In addition, in the conventional deposition method, the size of the mask has to be the same as the size of the substrate since the mask cannot be moved relative to the substrate. Thus, the size of the mask has to be increased as display devices become larger. However, it is not easy to manufacture such a large mask.

In order to overcome this problem, in the organic layer deposition apparatus 100 according to the current embodiment, the patterning slit sheet assembly 150 is disposed to be separated from the substrate 500 by a predetermined distance. Thus, it is possible to reduce or prevent defects from occurring due to the patterning slit sheet assembly 150 contacting the substrate 500 during the deposition process.

Figure 7:
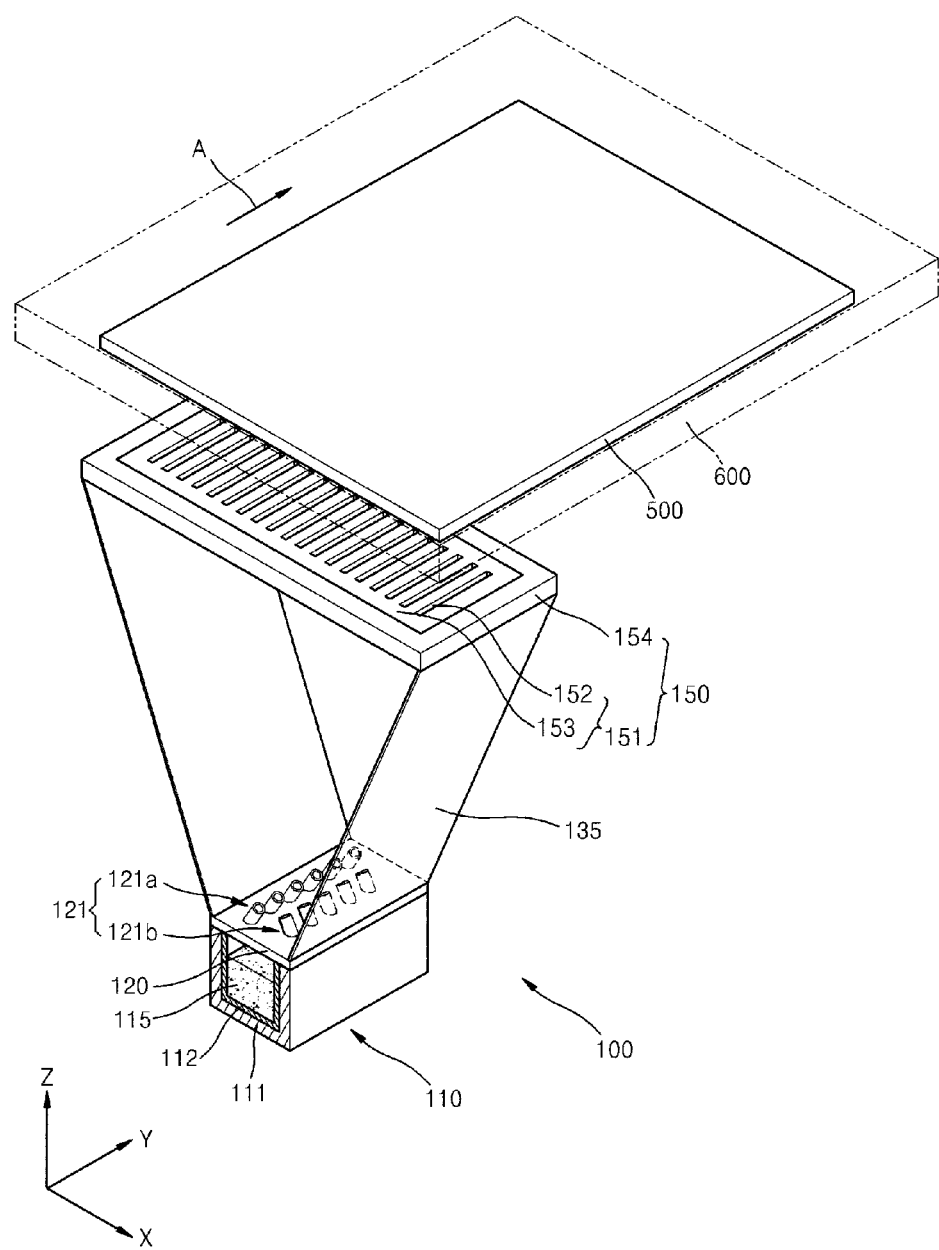
FIG. 7 is a schematic perspective view of an organic layer deposition apparatus according to another embodiment of the present invention.

Also, since the patterning slit sheet assembly 150 and particularly, the patterning slit sheet 151 may be formed to be smaller than the substrate 500, the patterning slit sheet assembly 150 may be manufactured in an easy manner FIG. 7 is a schematic perspective view of an organic layer deposition apparatus 100 according to another embodiment of the present invention. Referring to FIG. 7, the organic layer deposition apparatus 100 includes a deposition source 110, a deposition source nozzle unit 120, and a patterning slit sheet assembly 150.

The deposition source 110 includes a crucible 112 filled with a deposition material 115, and a cooling block 111 that heats the crucible 112 to vaporize the deposition material 115 in the crucible 112 toward the deposition source nozzle unit 120. The deposition source nozzle unit 120, which has a planar shape, is disposed at a side of the deposition source 110. The deposition source nozzle unit 120 includes a plurality of deposition source nozzles 121 arranged in the Y-axis direction. The patterning slit sheet assembly 150 is disposed between the deposition source 110 and a substrate 500. In addition, the deposition source 110 and the deposition source nozzle unit 120 may be connected to the patterning slit sheet assembly 150 by connection members 135.

The structure of the patterning slit sheet assembly 150 that includes the patterning slit sheet 151, a frame 154, and a support unit 160, is the same as that in the previous embodiments, and will thus not be described here again.

In the current embodiment, the plurality of deposition source nozzles 121 formed in the deposition source nozzle unit 120 are tilted at a set or predetermined angle, unlike the embodiment described with reference to FIG. 4. In particular, the deposition source nozzles 121 may include deposition source nozzles 121$a$ and 121$b$ arranged in two rows. The deposition source nozzles 121$a$ and 121$b$ may be arranged in two rows to alternate in a zigzag pattern. The deposition source nozzles 121$a$ and 121$b$ may be tilted at a set or predetermined angle on an XZ plane.

In the current embodiment, the deposition source nozzles 121$a$ and 121$b$ are arranged to tilt at a set or predetermined angle. The deposition source nozzles 121$a$ in a first row and the deposition source nozzles 121$b$ in a second row may tilt to face each other. That is, the deposition source nozzles 121$a$ of the first row in a left part of the deposition source nozzle unit 120 may tilt to face a right side portion of the patterning slit sheet assembly 150, and the deposition source nozzles 121$b$ of the second row in a right part of the deposition source nozzle unit 120 may tilt to face a left side portion of the patterning slit sheet assembly 150.

Due to the structure of the organic layer deposition apparatus 100 according to the current embodiment, the deposition of the deposition material 115 may be adjusted to lessen a thickness variation between the center and the end portions of a thin film on the substrate 500 and improve thickness uniformity of the thin film. Moreover, utilization efficiency of the deposition material 115 may also be improved.

Figure 8:
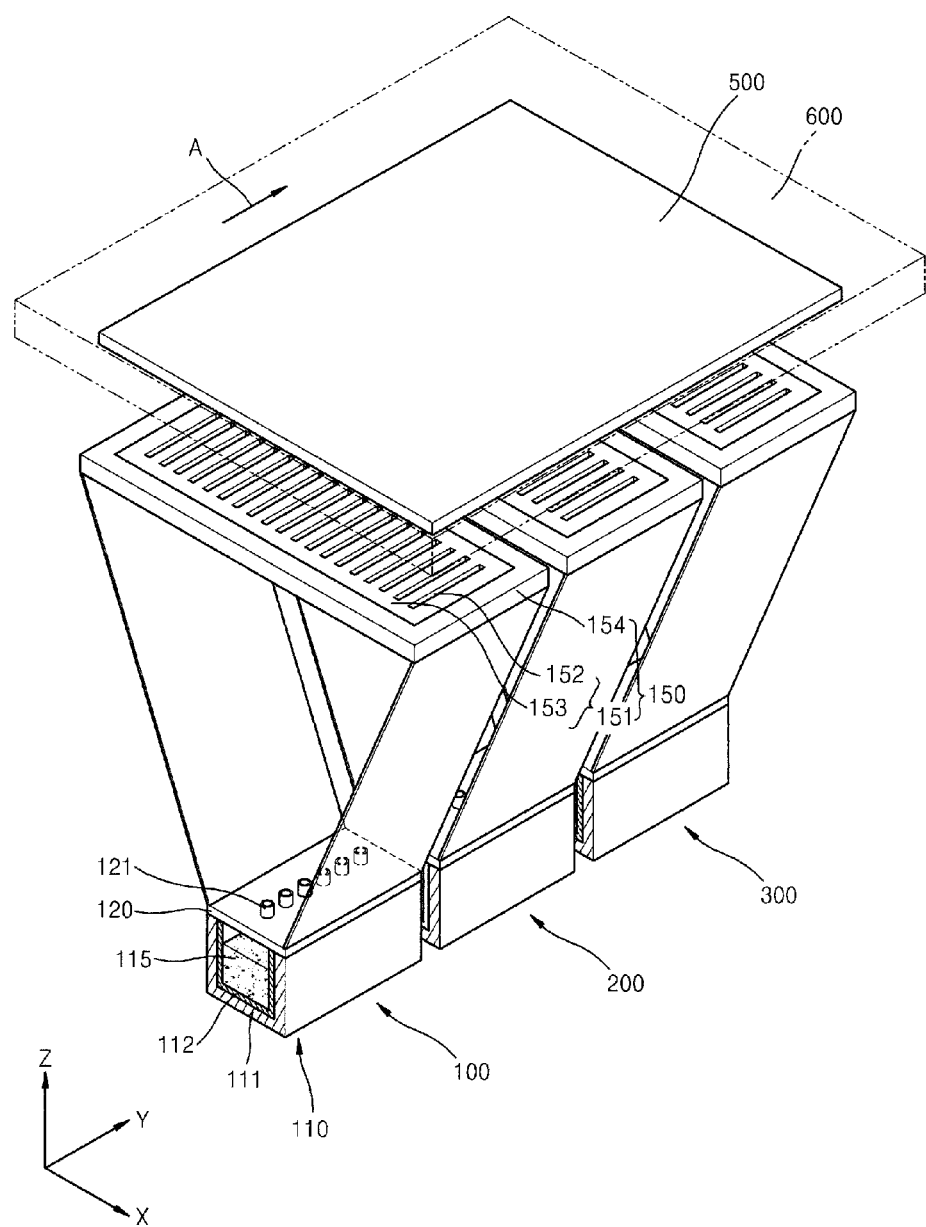
FIG. 8 is a schematic perspective view of an organic layer deposition apparatus according to another embodiment of the present invention.

FIG. 8 is a schematic perspective view of an organic layer deposition apparatus according to another embodiment of the present invention. Referring to FIG. 8, the organic layer deposition apparatus may include a plurality of organic layer deposition apparatuses, each of which has the same structure as the organic layer deposition apparatus 100 illustrated in FIGS. 4 to 6. The organic layer deposition apparatus according to the current embodiment may include a multi-deposition source unit formed of a plurality of deposition sources and that concurrently or simultaneously discharges different deposition materials for respectively forming a red (R) emission layer, a green (G) emission layer, and a blue (B) emission layer.

In particular, the organic layer deposition apparatus according to the current embodiment includes a first organic layer deposition apparatus 100, a second organic layer deposition apparatus 200, and a third organic layer deposition apparatus 300. Each of the first to third organic layer deposition apparatuses 100 to 300 has the same structure as the organic layer deposition apparatus 100 described with reference to FIGS. 4 through 6, and thus a detailed description thereof will not be provided here.

Also, the structure of a patterning slit sheet assembly 150 that includes a patterning slit sheet 151, a frame 154, and a support unit 160, is the same as those in the previous embodiments, and will thus not be described here again.

The deposition sources of the first organic layer deposition apparatus 100, the second organic layer deposition apparatus 200, and the third organic layer deposition apparatus 300 may contain different deposition materials, respectively. For example, the first organic layer deposition apparatus 100 may contain a deposition material for forming a red (R) emission layer, the second organic layer deposition apparatus 200 may contain a deposition material for forming a green (G) emission layer, and the third organic layer deposition apparatus 300 may contain a deposition material for forming a blue (B) emission layer.

Thus, if the organic layer deposition apparatus according to the current embodiment is used, the red (R) emission layer, the green (G) emission layer, and the blue (B) emission layer may be simultaneously formed by using the multi-deposition source unit. Thus, a time needed to manufacture an organic light emitting display device is sharply reduced. In addition, the organic light emitting display device may be manufactured with a reduced number of chambers, so that equipment costs are also markedly reduced.

Although not illustrated, the patterning slit sheet assemblies 150 of the first organic layer deposition apparatus 100, the second organic layer deposition apparatus 200, and the third organic layer deposition apparatus 300 may be arranged to be offset by a constant or identical distance with respect to each other, thereby preventing deposition regions corresponding to the patterning slit sheets 150 from overlapping with one another on a substrate 500. In other words, if the first organic layer deposition apparatus 100, the second organic layer deposition apparatus 200, and the third organic layer deposition apparatus 300 are used to deposit the R emission layer, the G emission layer, and the B emission layer, respectively, then patterning slits 152 of the patterning slit sheet 151 of the first organic layer deposition apparatus 100, patterning slits 152 of the patterning slit sheet 151 of the second organic layer deposition apparatus 200, and patterning slits 152 of the patterning slit sheet 151 of the third organic layer deposition apparatus 300 are arranged not to be aligned or overlapped with respect to each other, thereby respectively forming the R emission layer, the G emission layer, and the B emission layer in different regions of the substrate 500.

The deposition materials for respectively forming the R emission layer, the G emission layer, and the B emission layer may be vaporized at different temperatures. Therefore, the temperatures of deposition sources of the respective first to third organic layer deposition apparatuses 100 to 300 may be set to be different.

Although the organic layer deposition apparatus according to the current embodiment includes three organic layer deposition apparatuses 100 to 300, the present invention is not limited thereto. In other words, an organic layer deposition apparatus according to another embodiment of the present invention may include a plurality of organic layer deposition apparatuses, each of which contains a different deposition material. For example, an organic layer deposition apparatus according to another embodiment of the present invention may include five organic layer deposition apparatuses respectively containing materials for an R emission layer, a G emission layer, a B emission layer, an auxiliary R' layer of the R emission layer, and an auxiliary G' layer of the G emission layer.

As described above, an organic layer deposition apparatus may include a plurality of organic layer deposition apparatuses to concurrently or simultaneously form a plurality of thin films, thereby improving manufacturing yield and deposition efficiency. In addition, the overall manufacturing process is simplified, and the manufacturing costs are reduced.

Figure 9:
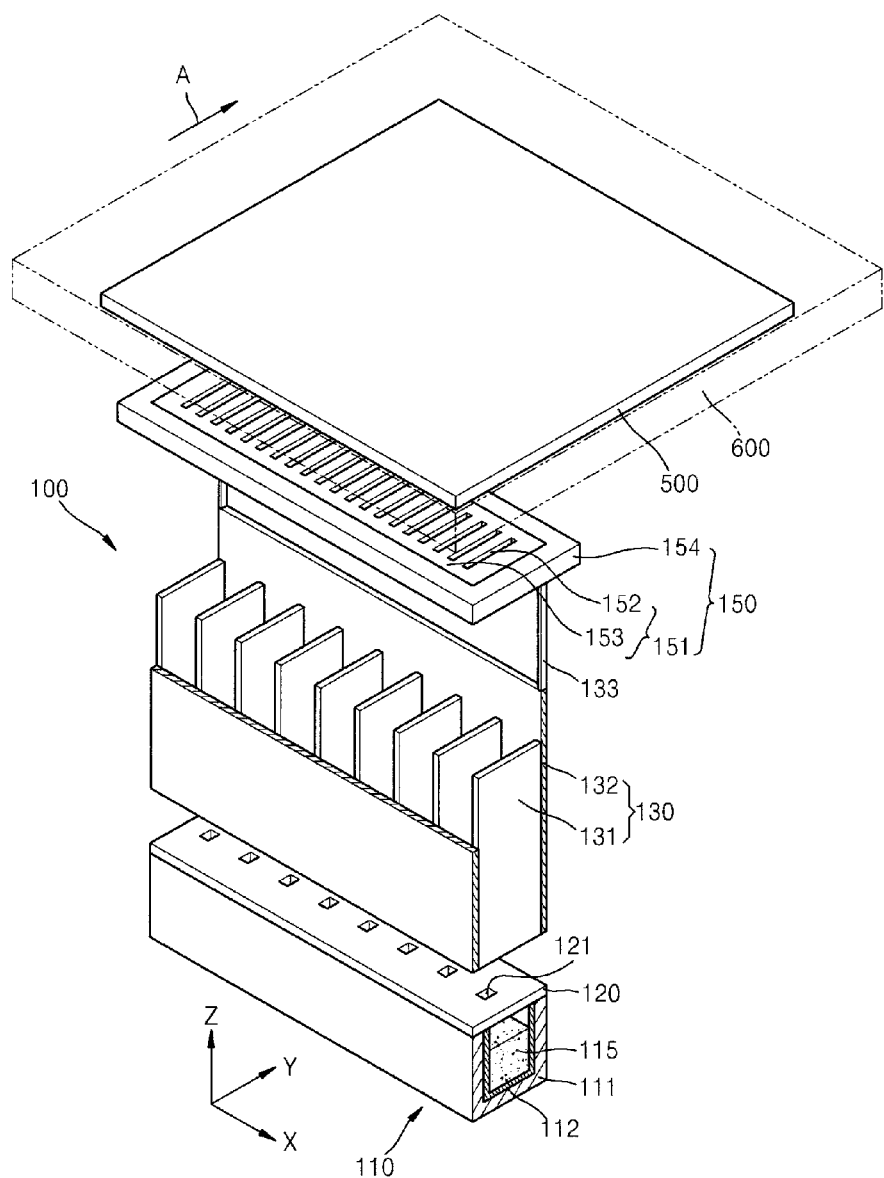
FIG. 9 is a schematic perspective cutaway view of an organic layer deposition apparatus according to another embodiment of the present invention.
Figure 10:
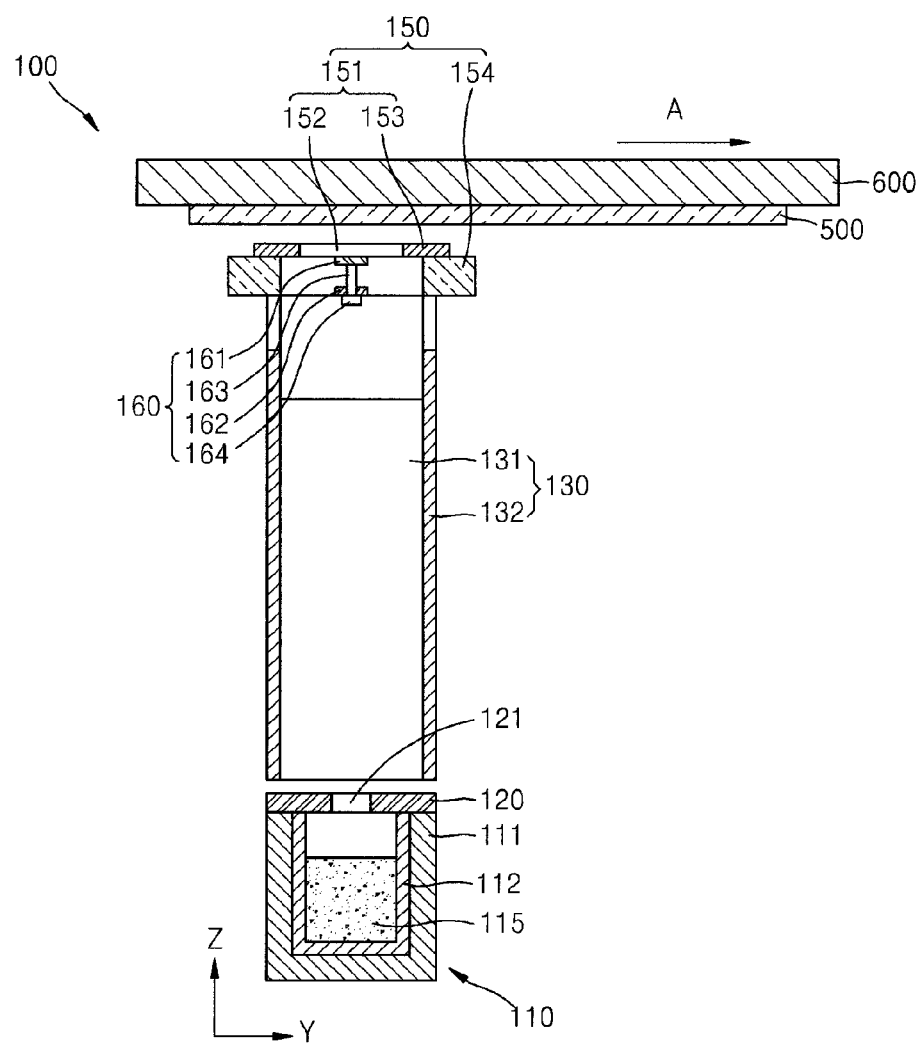
FIG. 10 is a schematic side sectional view of the organic layer deposition apparatus of FIG. 9.
Figure 11:
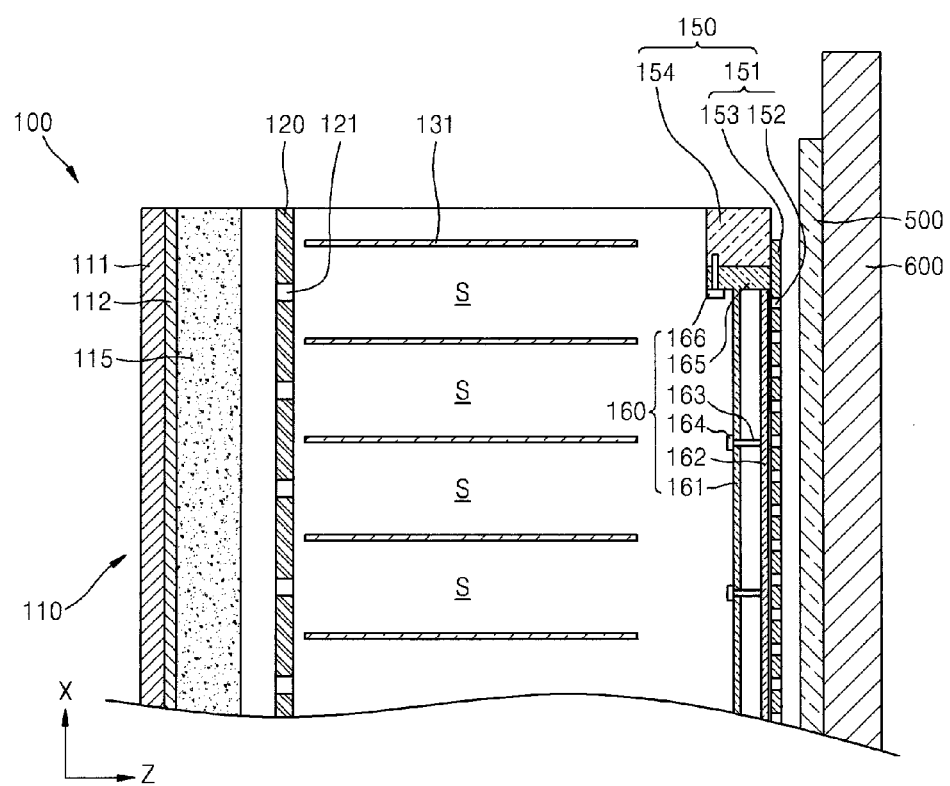
FIG. 11 is a schematic plan sectional view of the organic layer deposition apparatus of FIG. 9.

FIG. 9 is a schematic perspective cutaway view of an organic layer deposition apparatus 100 according to an embodiment of the present invention. FIG. 10 is a schematic side sectional view of the organic layer deposition apparatus 100 of FIG. 9. FIG. 11 is a schematic plan sectional view of the organic layer deposition apparatus 100 of FIG. 9.

Referring to FIGS. 9 through 11, the organic layer deposition apparatus 100 includes a deposition source 110, a deposition source nozzle unit 120, a patterning slit sheet assembly 150, and a barrier plate assembly 130. Although not illustrated in FIGS. 9 through 11 for convenience of explanation, all the components of the organic layer deposition apparatus 100 may be disposed within a chamber that is maintained at an appropriate degree of vacuum. The chamber is maintained at an appropriate degree of vacuum in order to allow a deposition material 115 to move in a substantially straight line through the organic layer deposition apparatus 100.

In the chamber, a substrate 500 that is a deposition target is transferred by an electrostatic chuck 600. The substrate 500 may be a substrate for flat panel displays. A large substrate, such as a mother glass, for manufacturing a plurality of flat panel displays, may be used as the substrate 500. Other substrates may also be employed.

In the current embodiment, the substrate 500 may be moved relative to the organic layer deposition apparatus 100, and particularly, in a direction of an arrow A, relative to the organic layer deposition apparatus 100.

Similar to the previous embodiments described above, in the organic layer deposition apparatus 100 according to the current embodiment, the patterning slit sheet assembly 150 may be significantly smaller than a FMM used in a conventional deposition method. In other words, in the organic layer deposition apparatus 100, deposition is continuously performed, i.e., in a scanning manner while the substrate 500 is moved in the Y-axis direction. Thus, a length of a patterning slit sheet 151 in the Y-axis direction may be significantly less than a length of the substrate 500 provided a width of the patterning slit sheet 151 in the X-axis direction and a width of the substrate 500 in the X-axis direction are substantially equal to each other. However, even when the width of the patterning slit sheet 151 in the X-axis direction is less than the width of the substrate 500 in the X-axis direction, deposition may be performed on the entire substrate 500 in the scanning manner while the substrate 500 or the organic layer deposition apparatus 100 is moved relative to the other.

As described above, since the patterning slit sheet 151 may be formed to be significantly smaller than a FMM used in a conventional deposition method, it is relatively easy to manufacture the patterning slit sheet 151 used in the present invention.

The deposition source 110 that contains and heats the deposition material 115 is disposed at a side facing the substrate 500. In particular, the deposition source 110 includes a crucible 112 filled with the deposition material 115, and a cooling block 111 surrounding the crucible 112. The cooling block 111 reduces or prevents radiation of heat from the crucible 112 to the outside. The cooling block 111 may include a heater that heats the crucible 112.

The deposition source nozzle unit 120 is disposed at a side of the deposition source 110, and in particular, at the side of the deposition source 110 facing the substrate 500. The deposition source nozzle unit 120 includes a plurality of deposition source nozzles 121 that may be arranged at equal intervals in the X-axis direction. The deposition material 115 that is vaporized in the deposition source 110 passes through the deposition source nozzles 121 of the deposition source nozzle unit 120 towards the substrate 500 that is a deposition target.

The barrier plate assembly 130 is disposed at a side of the deposition source nozzle unit 120. The barrier plate assembly 130 includes a plurality of barrier plates 131, and a barrier plate frame 132 that covers sides of the barrier plates 131. The plurality of barrier plates 131 may be arranged parallel to each other at equal intervals in the X-axis direction. In addition, each of the barrier plates 131 may be arranged parallel to a YZ plane in FIG. 9, and may have a rectangular shape. The plurality of barrier plates 131 arranged as described above partition a deposition space between the deposition source nozzle unit 120 and the patterning slit sheet assembly 150 into a plurality of sub-deposition spaces S. In the organic layer deposition apparatus 100, as illustrated in FIG. 11, the deposition space is divided by the barrier plates 131 into the sub-deposition spaces S that respectively correspond to the deposition source nozzles 121 through which the deposition material 115 is discharged.

The barrier plates 131 may be respectively disposed between adjacent deposition source nozzles 121. In other words, each of the deposition source nozzles 121 may be disposed between two adjacent barrier plates 131. The deposition source nozzles 121 may be respectively located at the midpoint between two adjacent barrier plates 131. However, the present invention is not limited to this structure. For example, a plurality of deposition source nozzles 121 may be disposed between two adjacent barrier plates 131. In this case, the deposition source nozzles 121 may be also respectively located at the midpoint between two adjacent barrier plates 131.

Since the barrier plates 131 partition the space between the deposition source nozzle unit 120 and the patterning slit sheet assembly 150 into the plurality of sub-deposition spaces S as described above, the deposition material 115 discharged through each of the deposition source nozzles 121 is not mixed with the deposition material 115 discharged through the other deposition source nozzles slits 121, and passes through a plurality of patterning slits 152 of the patterning slit sheet assembly 150 so as to be deposited on the substrate 500. In other words, the barrier plates 131 guide the deposition material 115, which is discharged through the deposition source nozzles slits 121, to move straight, i.e., to flow in the Z-axis direction.

As described above, the deposition material 115 is forced or guided to move straight by installing the barrier plates 131, so that a smaller shadow zone may be formed on the substrate 500 compared to a case where no barrier plates are installed. Thus, the organic layer deposition apparatus 100 and the substrate 500 may be separated from each other by a set or predetermined distance. This will be described later in detail.

The barrier plate frame 132, which covers the sides of the barrier plates 131, maintains the positions of the barrier plates 131, and guides the deposition material 115, which is discharged through the deposition source nozzles 121, not to flow in the Y-axis direction.

The deposition source nozzle unit 120 and the barrier plate assembly 130 may be separated from each other by a set or predetermined distance. This may reduce or prevent heat radiated from the deposition source unit 110 from being conducted to the barrier plate assembly 130. However, aspects of the present invention are not limited to this. For example, when an appropriate heat insulator is disposed between the deposition source nozzle unit 120 and the barrier plate assembly 130, the deposition source nozzle unit 120 and the barrier plate assembly 130 may be bound together with the heat insulator therebetween.

In addition, the barrier plate assembly 130 may be constructed to be detachable from the organic layer deposition apparatus 100. In the organic layer deposition apparatus 100 according to the current embodiment of the present invention, the deposition space is enclosed by using the barrier plate assembly 130, so that the deposition material 115 that remains undeposited is mostly deposited within the barrier plate assembly 130. Thus, since the barrier plate assembly 130 is constructed to be detachable from the organic layer deposition apparatus 100, when a large amount of the deposition material 115 lies in the barrier plate assembly 130 after a long deposition process, the barrier plate assembly 130 may be detached from the organic layer deposition apparatus 100 and then placed in a separate deposition material recycling apparatus in order to recover the deposition material 115. Due to the structure of the organic layer deposition apparatus 100 according to the current embodiment, a reuse rate of the deposition material 115 is increased, so that the deposition efficiency is improved, and thus the manufacturing costs are reduced.

The patterning slit sheet assembly 150 is disposed between the deposition source 110 and a substrate 500. A shape of the frame 154 is similar to a window frame. The patterning slit sheet 151 is combined with the frame 154. The patterning slit sheet 151 includes the plurality of slits 152 and a non-slit region 153. The plurality of slits 152 are formed in an X-axis direction.

The patterning slit sheet assembly 150 further includes a support unit 160. An upper member 161 and a lower member 162 of the support unit 160 are formed to be long in a direction in which the plurality of slits 152 are arranged, i.e., in the X-axis direction.

The structure of the patterning slit sheet assembly 150 that includes the patterning slit sheet 151, the frame 154, and the support unit 160, is the same as those in the previous embodiments, and will thus not be described here again.

In the organic layer deposition apparatus 100 according to the current embodiment, the total number of the plurality of slits 152 is greater than that of the deposition source nozzles 121. In addition, the total number of the patterning slits 152 disposed between two adjacent barrier plates 131 is greater than the total number of deposition source nozzles 121 disposed between two adjacent barrier plates 131. The number of the plurality of slits 152 may be equal to that of deposition patterns to be formed on the substrate 500.

The barrier plate assembly 130 and the patterning slit sheet assembly 150 may be disposed to be separated from each other by a set or predetermined distance, and may be connected by connection members 133.

The temperature of the barrier plate assembly 130 may increase to 100° C. or higher due to the deposition source 110 whose temperature is high. Thus, the barrier plate assembly 130 and the patterning slit sheet assembly 150 are separated from each other by the set or predetermined distance in order to protect or prevent the heat of the barrier plate assembly 130 from being conducted to the patterning slit sheet assembly 150.

As described above, the organic layer deposition apparatus 100 according to the current embodiment performs deposition while being moved relative to the substrate 500. In order to move the organic layer deposition apparatus 100 relative to the substrate 500, the patterning slit sheet assembly 150 is separated from the substrate 500 by a set or predetermined distance. In addition, in order to reduce or prevent formation of a relatively large shadow zone on the substrate 500 when the patterning slit sheet assembly 150 and the substrate 500 are disposed apart from each other, the barrier plates 131 are arranged between the deposition source nozzle unit 120 and the patterning slit sheet assembly 150 to guide or force the deposition material 115 to move in a straight direction. Thus, the size of the shadow zone that may be formed on the substrate 500 may be sharply reduced.

In the organic layer deposition apparatus 100 according to the current embodiment, the patterning slit sheet assembly 150 is disposed to be separated from the substrate 500 by a set or predetermined distance. Thus, it is possible to reduce or prevent defects from occurring when the patterning slit sheet assembly 150 contacts the substrate 500 during the deposition process.

Also, since the patterning slit sheet assembly 150 and particularly, the patterning slit sheet 151 may be formed to be smaller than the substrate 500, the patterning slit sheet assembly 150 may be manufactured in an easy manner.

Figure 12:
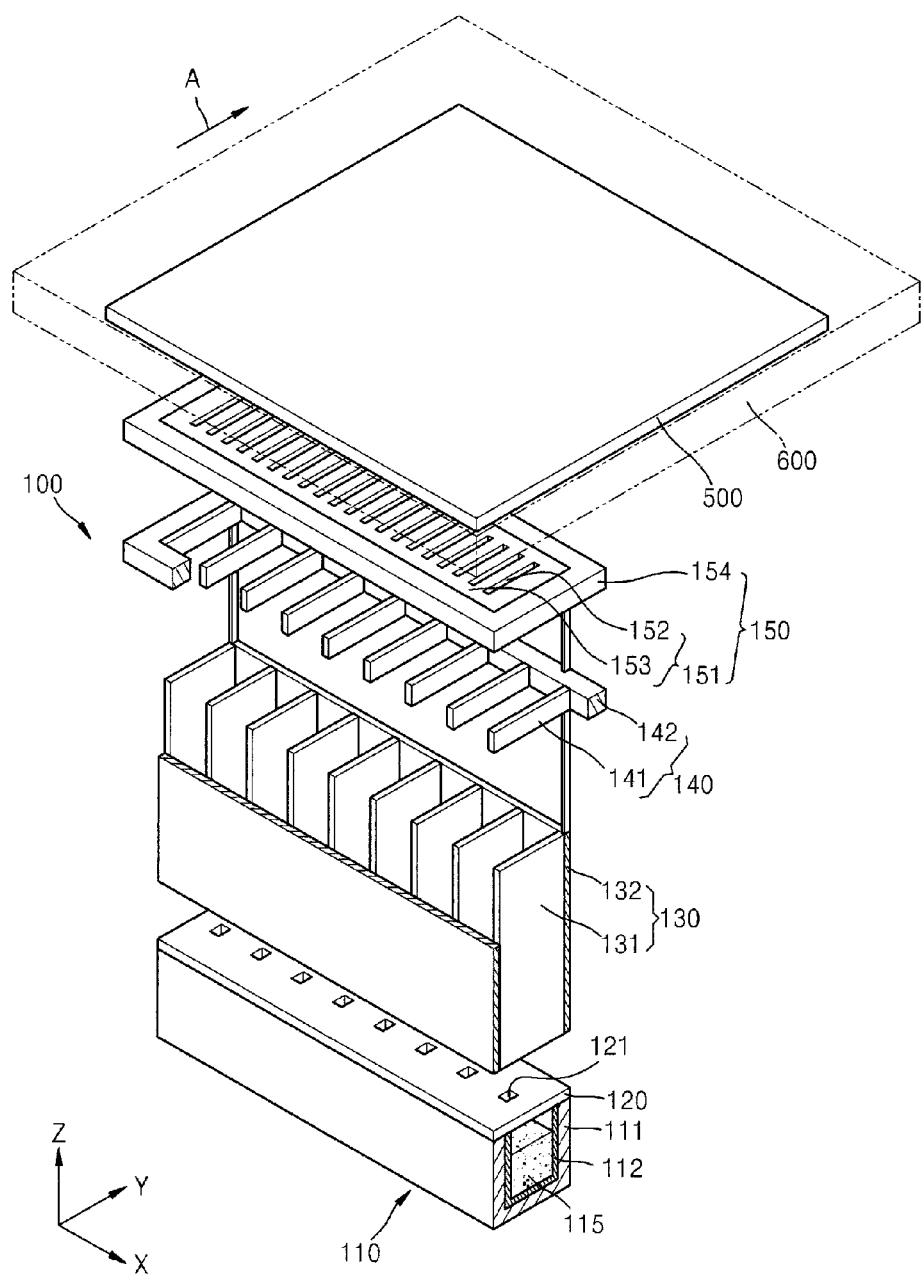
FIG. 12 is a schematic perspective cutaway view of an organic layer deposition apparatus according to another embodiment of the present invention.

FIG. 12 is a schematic perspective cutaway view of an organic layer deposition apparatus 100 according to another embodiment of the present invention. Referring to FIG. 12, the organic layer deposition apparatus 100 includes a deposition source 110, a deposition source nozzle unit 120, a first barrier plate assembly 130, a second barrier plate assembly 140, and a patterning slit sheet assembly 150. Although not illustrated in FIG. 12 for convenience of explanation, all the components of the organic layer deposition apparatus 100 may be disposed within a chamber that is maintained at an appropriate degree of vacuum. The chamber is maintained at an appropriate degree of vacuum in order to allow a deposition material 115 to move in a substantially straight line through the organic layer deposition apparatus 100.

A substrate 500, which is a deposition target, is disposed in the chamber. The deposition source 110 that contains and heats a deposition material 115 is disposed at an opposite side of the chamber to a side at which the substrate 500 is disposed. The structure of the deposition source 110 is the same as that in the embodiment described above with reference to FIG. 11, and thus a detailed description thereof will not be provided here. The first barrier plate assembly 130 is also the same as the barrier plate assembly 130 of the embodiment described above with reference to FIG. 11, and thus a detailed description thereof will not be provided here.

The structure of a patterning slit sheet assembly 150 that includes a patterning slit sheet 151, a frame 154, and a support unit 160 is also the same as those in the previous embodiments and will thus not be described here again.

In the current embodiment, the second barrier plate assembly 140 is disposed at a side of the first barrier plate assembly 130. The second barrier plate assembly 140 includes a plurality of second barrier plates 141 and a second barrier plate frame 142 that covers sides of the plurality of second barrier plates 141.

The plurality of second barrier plates 141 may be arranged parallel to each other at equal intervals in the X-axis direction. In addition, each of the plurality of second barrier plates 141 may be formed to extend in the YZ plane in FIG. 12, i.e., perpendicular to the X-axis direction.

The plurality of first barrier plates 131 and the plurality of second barrier plates 141 arranged as described above partition a deposition space between the deposition source nozzle unit 120 and the patterning slit sheet assembly 150. The deposition space is divided by the plurality of first barrier plates 131 and the plurality of second barrier plates 141 into sub-deposition spaces that respectively correspond to a plurality of deposition source nozzles 121 through which the deposition material 115 is discharged.

The plurality of second barrier plates 141 may be disposed to respectively correspond to the first barrier plates 131. In other words, the plurality of second barrier plates 141 may be aligned with respect to the plurality of first barrier plates 131, respectively. That is, each pair of the corresponding first and second barrier plates 131 and 141 may be located on the same plane. The plurality of first barrier plates 131 and the plurality of second barrier plates 141 are respectively illustrated as having the same thickness in the X-axis direction, but aspects of the present invention are not limited thereto. In other words, the second barrier plates 141, which need to be accurately aligned with the plurality of slits 152 of the patterning slit sheet 151, may be formed to be relatively thin, whereas the first barrier plates 131, which do not need to be precisely aligned with the plurality of slits 152, may be formed to be relatively thick. This makes it easier to manufacture the organic layer deposition assembly 100.

Also, a plurality of the organic layer deposition apparatuses 100 may be continuously arranged as illustrated in FIG. 8.

Figure 13:
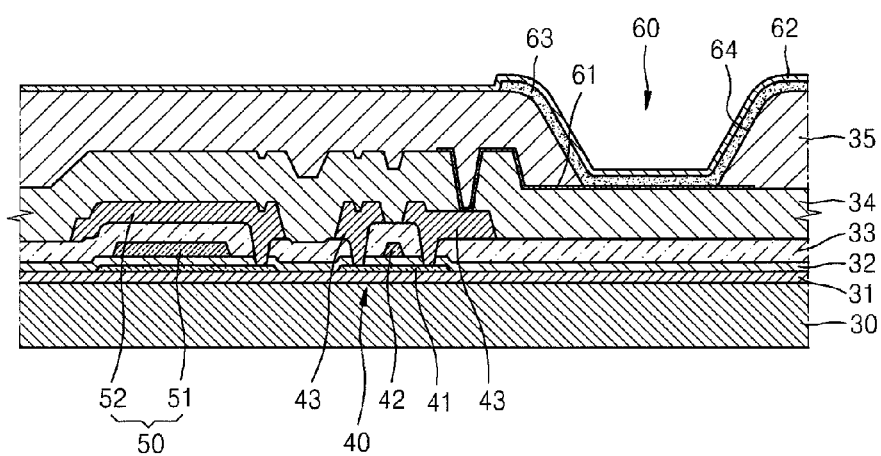
FIG. 13 is a schematic cross-sectional view of an organic light-emitting display device manufactured by using an organic layer deposition apparatus, according to an embodiment of the present invention.

FIG. 13 is a schematic cross-sectional view of an organic light-emitting display device manufactured by using an organic layer deposition apparatus, according to an embodiment of the present invention. Referring to FIG. 13, the organic light-emitting display device is formed on a substrate 30. The substrate 30 may be formed of a transparent material, for example, glass, plastic, or metal. A buffer layer 31 containing an insulating material is formed on an entire surface of the substrate 30.

A thin film transistor (TFT) 40, a capacitor 50, and an organic light-emitting device (OLED) 60 are disposed on the insulating layer 31. The TFT 40 includes an active layer 41, a gate electrode 42, and a source/drain electrode 43. The OLED 60 includes a first electrode 61, a second electrode 62, and an intermediate layer 63. The capacitor 50 includes a first capacitor electrode 51 and a second capacitor electrode 52.

In detail, the active layer 41 is formed in a set or predetermined pattern on the buffer layer 31. The active layer 41 may include a p-type or n-type semiconductor material. A gate insulating layer 32 is formed on the active layer 41. The gate electrode 42 is formed on a region of the gate insulating layer 32 corresponding to the active layer 41. An interlayer insulating layer 33 may cover the gate electrode 42, and source/drain electrode 43 may be disposed on the interlayer insulating layer 43 to contact a set or predetermined region of the active layer 41. A passivation layer 34 is formed covering the source/drain electrode 43, and an additional insulating layer may be formed on the passivation layer 34 to planarize the passivation layer 34. Here, the interlayer insulating layer 43 is also between the first capacitor electrode 51 and the second capacitor electrode 52.

The first electrode 61 is formed on the passivation layer 34. The first electrode 61 is electrically connected to the drain electrode 43. A pixel defining layer 35 is formed covering the first electrode 61. An opening 64 is formed in the pixel defining layer 35, and the intermediate layer 63 including an organic emission layer (not shown) is formed in a region defined by the opening 64. The second electrode 62 is formed on the intermediate layer 63.

The intermediate layer 63 including the organic emission layer may be formed using the patterning slit sheet assembly 150 and an organic layer deposition apparatus including the patterning slit sheet assembly 150, such as those in the previous embodiments.

Specifically, after the opening 64 is formed in the pixel defining layer 35, the substrate 30 is transferred to a chamber (not shown. Then, a deposition process is performed using a desired deposition material to form the intermediate layer 63 in a desired pattern.

The organic layer deposition apparatuses according to the above embodiments of the present invention may be applied to form an organic or inorganic layer of an organic TFT, and to form layers from various suitable materials.

As described above, with a patterning slit sheet assembly, an organic layer deposition apparatus, a method of manufacturing an organic light-emitting display apparatus, and the organic light-emitting display apparatus according to the present invention, it is possible to deposit a thin film in a fine pattern.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing an organic light-emitting display apparatus, the method comprising:
    forming a first electrode on a substrate;
    forming an intermediate layer on the first electrode, the intermediate layer including an organic emission layer; and
    forming a second electrode on the intermediate layer,
    wherein the forming of the intermediate layer is performed by using an organic layer deposition apparatus and while the substrate is moved relative to the organic layer deposition apparatus in a first direction,
    wherein the organic layer deposition apparatus comprises:
        a deposition source for discharging a deposition material;
        a deposition source nozzle unit disposed at a side of the deposition source and comprising a plurality of deposition source nozzles arranged in the first direction;
        a patterning slit sheet assembly comprising:
            a patterning slit sheet having a plurality of slits;
            a frame combined with the patterning slit sheet to support the patterning slit sheet; and
            a support unit comprising:
                an upper member, which is movable and fixable, to support the patterning slit sheet when a gravitational force is applied to the patterning slit sheet, and
                a lower member disposed further from the patterning slit sheet than the upper member, wherein the upper member is fixed on the lower member,
                wherein the upper member is elongated in a second direction perpendicular to the first direction and overlaps with the plurality of slits when directly moved by a plurality of middle members which are disposed further from the patterning slit sheet than the upper member and passing through the lower member,
                wherein the support unit is located between the deposition source nozzle unit and the patterning slit sheet assembly; and
    wherein the organic layer deposition apparatus and the substrate are separated from each other, the substrate or the organic layer deposition apparatus is configured to be moved relative to the other in the first direction to perform a deposition, and the patterning slit sheet is smaller than the substrate in at least one of the first direction or the second direction.

2. An organic light-emitting display apparatus manufactured using the method of claim 1.

3. A method of manufacturing an organic light-emitting display apparatus, the method comprising:
    forming a first electrode on a substrate;
    forming an intermediate layer on the first electrode, the intermediate layer comprising an emission layer; and
    forming a second electrode on the intermediate layer,
    wherein the forming of the intermediate layer is performed by using an organic layer deposition apparatus and while the substrate is moved relative to the organic layer deposition apparatus,
    wherein the organic layer deposition apparatus comprises:
        a deposition source for discharging a deposition material;
        a deposition source nozzle unit disposed at a side of the deposition source and comprising a plurality of deposition source nozzles arranged in a first direction;
        a patterning slit sheet assembly comprising:
            a patterning slit sheet having a plurality of slits;
            a frame combined with the patterning slit sheet to support the patterning slit sheet; and
            a support unit comprising an upper member, which is movable and fixable, to support the patterning slit sheet when a gravitational force is applied to the patterning slit sheet, a lower member disposed further from the patterning slit sheet than the upper member, wherein when the upper member is fixed, it is fixed on the lower member, and a plurality of middle members, which are movable and fixable, disposed further from the patterning slit sheet than the upper member and passing through the lower member to directly move the upper member towards the plurality of slits such that the upper member overlaps with the plurality of slits,
            wherein the support unit is located between the deposition source nozzle unit and the patterning slit sheet assembly; and
        a barrier plate assembly comprising a plurality of barrier plates that are disposed between the deposition source nozzle unit and the patterning slit sheet assembly in the first direction and that partition a space between the deposition source nozzle unit and the patterning slit sheet assembly into a plurality of sub-deposition spaces,
    wherein the organic layer deposition apparatus and the substrate are separated from each other, the substrate or the organic layer deposition apparatus is configured to be moved relative to the other, and the patterning slit sheet is smaller than the substrate in at least one of the first direction or a second direction perpendicular to the first direction.

4. An organic light-emitting display apparatus manufactured using the method of claim 3.

* * * * *